(12) United States Patent
Kim et al.

(10) Patent No.: US 6,775,199 B2
(45) Date of Patent: Aug. 10, 2004

(54) SEMICONDUCTOR MEMORY DEVICE HAVING AN ARRAY VOLTAGE CONTROL CIRCUIT CONSTRUCTED WITH A PLURALITY OF FEEDBACK LOOPS

(75) Inventors: Doo-Young Kim, Seoul (KR); Byung-Chul Kim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/405,770

(22) Filed: Apr. 1, 2003

(65) Prior Publication Data

US 2003/0227812 A1 Dec. 11, 2003

(30) Foreign Application Priority Data

Jun. 8, 2002 (KR) ........................................ 2002-32138

(51) Int. Cl.[7] .............................. G11C 7/00; G11C 7/02; G11C 8/00
(52) U.S. Cl. .................. 365/226; 365/189.09; 365/207; 365/214; 365/230.03
(58) Field of Search ................................ 365/226, 214, 365/207, 189.09, 230.03

(56) References Cited

U.S. PATENT DOCUMENTS

| 5,268,871 A | | 12/1993 | Dhong et al. |
| 5,907,237 A | * | 5/1999 | Sekimoto ..................... 323/282 |
| 5,977,796 A | * | 11/1999 | Gabara ......................... 326/86 |
| 6,121,693 A | * | 9/2000 | Rock ............................ 307/18 |
| 6,307,802 B1 | | 10/2001 | Manning |
| 6,628,540 B2 | * | 9/2003 | Marshall et al. ............ 365/154 |

FOREIGN PATENT DOCUMENTS

JP  10050089 A  *  2/1998  ........... G11C/17/00

* cited by examiner

*Primary Examiner*—David Nelms
*Assistant Examiner*—Ly Duy Pham
(74) *Attorney, Agent, or Firm*—Marger Johnson & McCollom, P.C.

(57) ABSTRACT

The invention discloses a semiconductor memory device having an array voltage control circuit constructed with a plurality of feedback loops. In order to maintain constant the array voltage used for a single memory cell array region the plurality of feedback loops dividedly connect to a power line structure covering the memory cell array region, resulting in a reduction in the load to be taken by the output of feedback amplifiers to thereby achieve stable array voltage control operations.

7 Claims, 7 Drawing Sheets

US 6,775,199 B2

SEMICONDUCTOR MEMORY DEVICE HAVING AN ARRAY VOLTAGE CONTROL CIRCUIT CONSTRUCTED WITH A PLURALITY OF FEEDBACK LOOPS

BACKGROUND OF THE INVENTION

1. Field of the Invention

The present invention relates to a semiconductor memory device and, more particularly, to a semiconductor memory device having an array voltage control circuit to maintain an array voltage supplied to a memory cell array at a predetermined level.

2. Brief Description of Related Art

An array voltage control circuit maintains constant a level of an array voltage by detecting it at the memory core region of a semiconductor memory device during predetermined operations including a bit line sensing and then supplying the electric charge relating to the amount of consumed electric charge through an external supply voltage.

FIG. 1 illustrates an array voltage control circuit. With reference to FIG. 1, the array voltage control circuit is constructed in a mesh power structure. The structure relates to a single memory cell array connected to a column decoder 20 and a row decoder 30. The control circuit includes a mesh power supply liner 10 for supplying the array voltage to required parts of the memory cell array through the mesh power structure. An array voltage feedback amplifier 40 compares the array voltage fed back through a feedback bus AVFBUS connected to the power supply liner 10 with the array reference voltage VREFA. The amplifier 40 amplifies the resultant difference. An array voltage driver 50 applies an array external supply power voltage to the mesh power supply liner 10 responsive to the array voltage feedback amplifier 40.

FIG. 2 illustrates an embodiment of paths through which the array voltage passes to memory cells in a core region of dynamic random access memory (DRAM). As shown in FIG. 2 sense amplifier includes a pull down N-type sense amplifier 5 and a pull up P-type sense amplifier 4 arranged in reference to an I/O gate 6. Memory cell arrays 2 and 3 are constructed with a plurality of memory cells (MCs) connected to crossing points between a word line WL and bit lines BL and BLB. When a sense amplifier driving signal (LAPG) is applied at a low logic level during a data access process, an array voltage VccA applied from the mesh power supply liner 10 is provided to a node NO1 through a P-type MOS transistor PM1. The array voltage VccA applied to the node NO1 is supplied to the sense amplifier 4.The sense amplifier 4 performs detection and amplification operations responsive to a potential difference in the pair of bitlines BL and BLB. The array voltage, therefore, is used as a power source for memory cell operations. Each memory cell is constructed with an access transistor AT and a storage capacitor SC. In the case of a 512 mega-bit DRAM, 4 banks exist, each consisting of 128 megabits. One bank is constructed with 768 subblocks. One subblock is constructed with 512×352 memory cells. The array voltage VccA is applied by one mesh unit covering one subblock.

The array voltage control circuit operates as follows. When electric charge stored at the mesh power supply liner 10 is consumed by cell operations, e.g., a bitline sensing operation, the array voltage is reduced. The reduced array voltage is applied to an inverter terminal (−) of the array voltage feedback amplifier 40 through a feedback bus AVFBUS. The array voltage feedback amplifier 40 compares the fed back array voltage applied to the inverter (−) terminal with an array reference voltage applied to an un-inverted terminal (+) and generates the amplified feedback output in proportion to a resultant difference. An array voltage driver 50 receives an output of the array voltage feedback amplifier 40. If the voltage driver 50 is constructed with P-type MOS transistors P1–P12 the driver 50 outputs a drive voltage reduced in proportion to the output of the amplifier 40. In other words, the array voltage driver 50 is constructed with P-type MOS transistors, the feedback output is proportionally reduced by as much as the array voltage has been reduced in comparison with the array reference voltage. The feedback output VINTAEB of the array voltage feedback amplifier 40 is commonly applied to gates of the P-type MOS transistors of the array voltage driver 50 through a feedback amplifier output bus FAOBUS. If the feedback output VINTAEB respectively controls the gates of the transistors, all array external supply voltage VDDA is simultaneously applied to the mesh power supply liner 10 through drains of the transistors . Accordingly, the reduced level of array voltage at the mesh power supply liner 10 increases again to the level of array reference voltage. The array voltage gets to the array reference voltage in the process of the array voltage control operations. The increase in the array voltage is transmitted to the array voltage feedback amplifier 40 through the feedback bus AVFBUS. At this time, the feedback output VINTAEB is increasingly controlled for respective applications to the gates of the P-type MOS transistors. As a result, the P-type MOS transistors P1–P12 are turned off to shut down further inflow of electric charge, thereby maintaining the level of array voltage relevant to the array reference voltage.

The array voltage control circuit thus constructed includes a mesh power supply liner 10 corresponding to one memory cell array connected to a single column decoder and a single row decoder and a feedback loop for applying an array external supply voltage to the mesh power supply liner 10. Thus, the feedback loop includes the array voltage feedback amplifier 40 connected with a single feedback bus AVFBUS.

As integration increases in a semiconductor memory device, so do the dimensions of a memory cell array region. Particularly, a square chip is preferred due to packaging convenience. In a square chip, the horizontal and vertical lengths of an integrated memory chip are identical.

The length of the output bus FAOBUS of the array voltage feedback amplifier 40 increases and the number of MOS transistors constructing the array voltage driver 50. These increases cause a significant increase in the height of the memory cell array region increasing the load to be taken by the output of the array voltage feedback amplifier 40. The result is a big difference between the array supply voltage and the array reference voltage and a deterioration in the voltage response characteristics. This deterioration, in turn, might render the feedback operations unstable where the supply and control operations of array supply voltage cannot be rapidly performed.

Put differently, if the feedback output turns on the MOS transistors in the driver 50 due to a large output load, it takes longer to sufficiently replenish the electric charge. Even if the feedback output turns into the MOS transistors of the array voltage driver 50, it may take long to do so.

And the array voltage control circuit might become unstable during memory cell access operations. This results in increased restoring time restoring operation of relevant data at the time of sensing the bitlines. As a result, the array voltage control circuit deteriorates high speed operations of semiconductor memory devices.

SUMMARY OF THE INVENTION

An abject of the present invention is provide a semiconductor memory device having an improved array voltage control circuit that addresses the disadvantages associated with prior circuits.

It is another object of the present invention to provide a control method and the related circuit that can stably supply an array voltage and provide a faster feedback response.

It is still another object of the present invention to provide a semiconductor memory device having an array voltage control circuit and a related array voltage control method that can stabilize memory cell access operations in an array and minimize restoration of stored data at the time of bitline sensing.

It is still another object of the present invention to provide an array voltage control circuit having a plurality of feedback loops in a semiconductor memory device.

BRIEF DESCRIPTION OF THE DRAWINGS

The advantages of embodiments of the present invention will become more readily apparent from the description of the following drawings.

DETAILED DESCRIPTION

A semiconductor memory device having an improved array voltage control circuit consisting of a plurality of feedback loops will be described in detail with reference to accompanying drawings.

Figure 1:
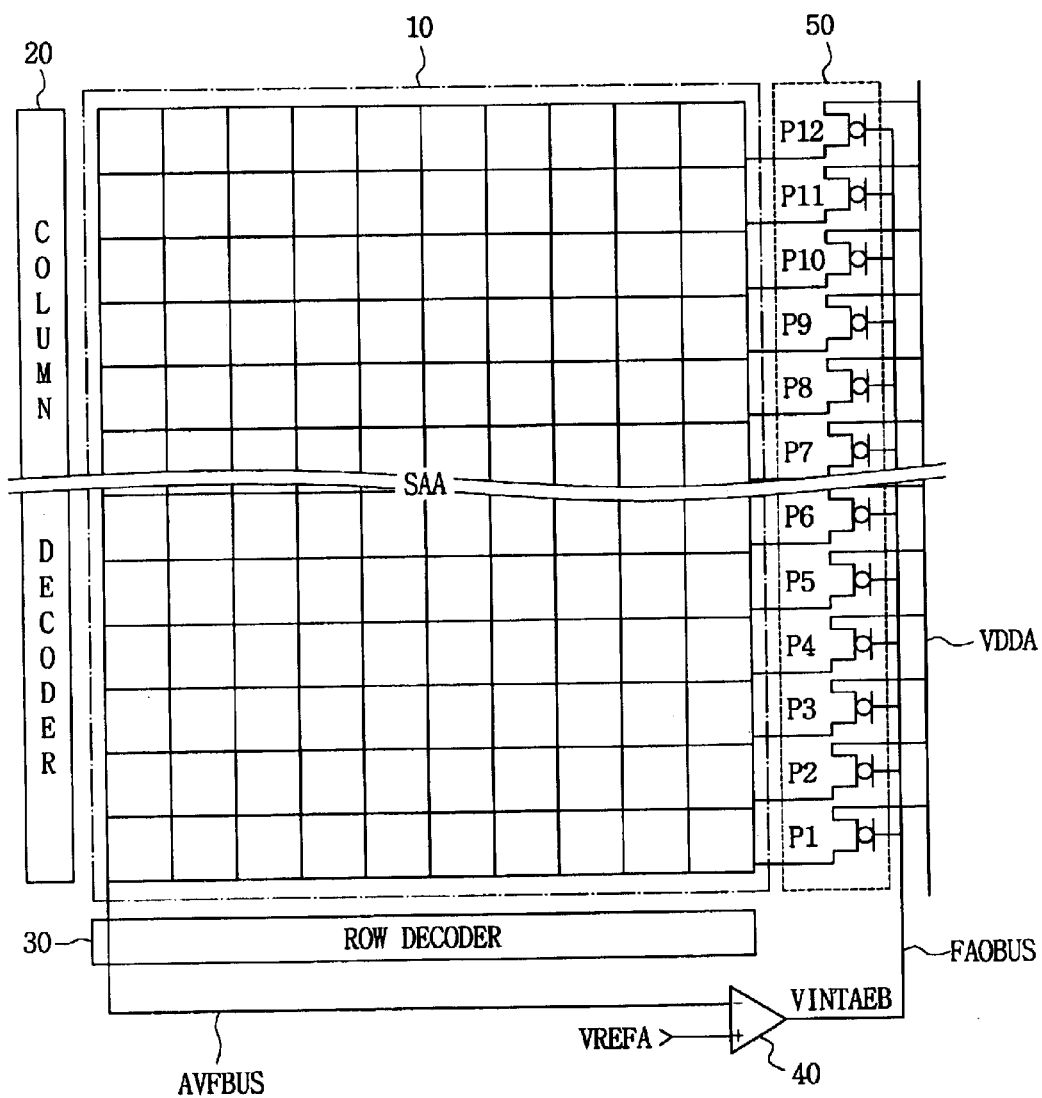
FIG. 1 is a block diagram of an array voltage control circuit.
Figure 2:
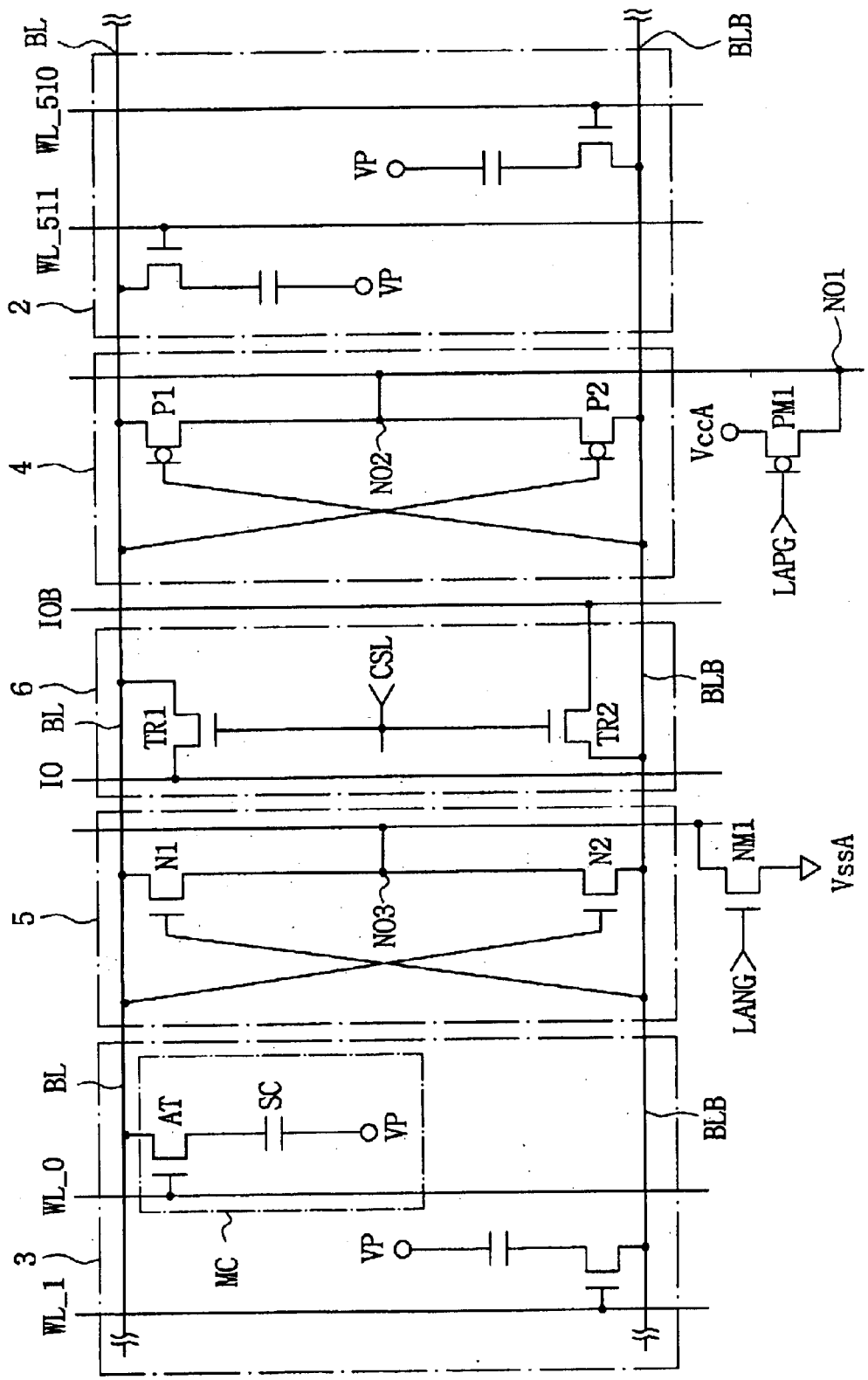
FIG. 2 is a circuit diagram of the array voltage control circuit shown in FIG. 1.
Figure 3:
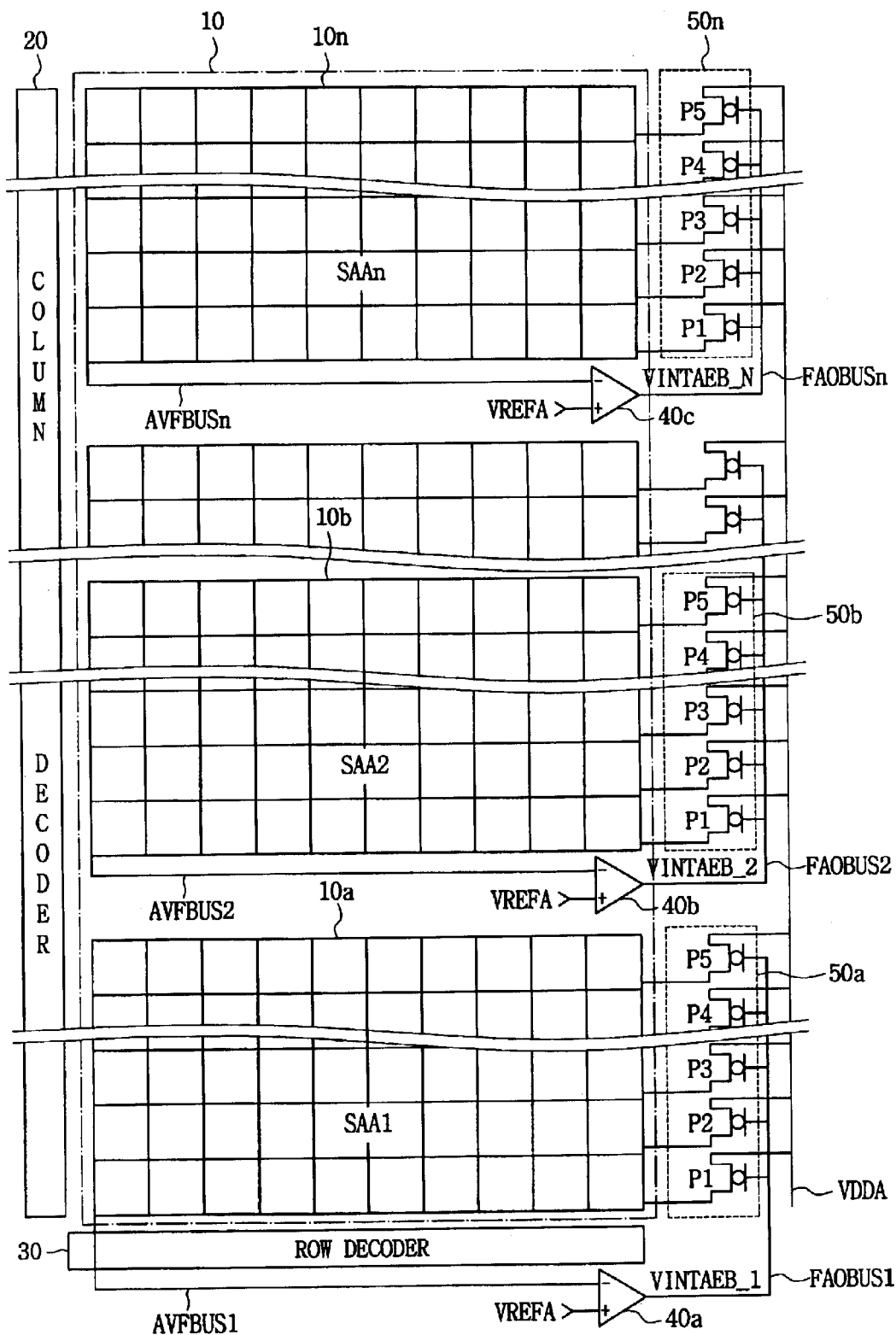
FIG. 3 is a block diagram of an embodiment of an array voltage control circuit according to the present invention.

FIG. 3 is a block diagram of an array voltage control circuit in accordance with a preferred embodiment of the present invention.

The array voltage control circuit 10 includes a plurality of divisional mesh power supply liners 10a, 10b, and 10n. The divisional mesh liners 10a, 10b, and 10n supply an array voltage to corresponding portions of the cell array through the divisional mesh power structure. The memory cell array is configured in a divisional mesh power structure where one memory cell array is connected to a column decoder 20 and a row decoder 30. A plurality of array voltage feedback amplifiers 40a, 40b, and 40c respectively compare the array voltage independently fed back through a plurality of feedback buses AVFBUS1, AVFBUS2, AVFBUSn with cell array reference voltage. The amplifiers 40a, 40b, and 40c amplify the resultant difference. A plurality of array voltage drivers 50a, 50b, and 50n independently apply an array external supply voltage to the divisional mesh power supply liners 10a, 10b, and 10n responsive to the output of the feedback amplifiers 40a, 40b, and 40c.

The array voltage control circuit, therefore, includes a plurality of feedback loops. In other words, the voltage control circuit includes a plurality of array voltage feedback amplifiers 40a, 40b, 40c correspondingly connected with a plurality of feedback buses (AVFBUS1, AVFBUS2, AVFBUSn). Also, the array voltage control circuit is constructed in a divisional mesh power structure divided correspondingly to one memory cell array.

Electric charge stored in the liner 10a when an access operation is performed on memory cells belonging to a divisional mesh power supply liner 10a. As a result, the reduced array voltage is applied to an inverted terminal (−) of the amplifier 40a through the first feedback bus AVFBUS1. And the array voltage feedback amplifier 40a compares the fed back array voltage applied to the inverted terminal (−) with a predetermined reference voltage VREFA applied through the non-inverted terminal (+) to generate an amplified feedback output proportional to the resultant difference. The feedback output is provided after being proportionally reduced by the array voltage VccA. The feedback output is compared with the array reference voltage VREFA. The feedback output VINTAEB_1 of the array voltage feedback amplifier 40a is commonly applied to gates of P-type MOS transistors P1–P5 in an array voltage driver 50a among array voltage drivers 50a, 50b, and 50n through a feedback amplifier output bus FAOBUS1. The feedback output VINTAEB_1 commonly controls respective gates of the transistors. The array external supply voltage VDDA is applied through drains of the transistors to the mesh power supply liner 10a. Accordingly, the level of the reduced array voltage of the liner 10a increases again to the level of the array reference voltage VREFA. As the array voltage control operations are performed, the array voltage reaches the array reference voltage, and the increase in the array voltage is conveyed to the array voltage feedback amplifier 40a through the feedback bus AVFBUS1. At this time, the P-type MOS transistors P1–P5 turn off, thereby maintaining the level of array voltage corresponding to that of the array reference voltage.

In one embodiment of the present invention, the number of the P-type MOS transistors P1–P5 is 5. A person of reasonable skill in the art should understand a larger or smaller number of transistors comes within the scope of the invention.

The array voltage control circuit thus constructed has a plurality of feedback loops corresponding to one memory cell array, so that there can be a significant reduction in the load taken by the output of the array voltage feedback amplifiers. Therefore, the voltage response characteristics are faster without a big difference between the array supply voltage and the array reference voltage. With a faster voltage response characteristics, a more stable feedback operation exists to thereby speed up and smooth control operations of the array supply voltage. In other words, a reduction in the output load shortens the time for sufficient supply of electric charge and the time for turning off MOS transistors.

Finally, and the array voltage control circuit significantly shortens the restoration time of relevant data in the memory cells compared to the circuit with a single feedback loop. Also, the more feedback loops are used, the smaller the output load gets. Meanwhile, the divisional mesh power supply liners 10a, 10b, 10n are constructed in a plurality divided mesh structures. The power supply liners 10a, 10b, and 10n are arranged as shown in FIG. 3 in order to make the array voltage control operations much faster by reducing the total resistance capacity product (RC product) of the array power structure. A person of reasonable skill in the art should understand that the number of feedback loops is bounded by the integration degree and density.

FIGS. 4 through 7 are block diagrams of other embodiments of array voltage control circuit of the present invention.

Figure 4:
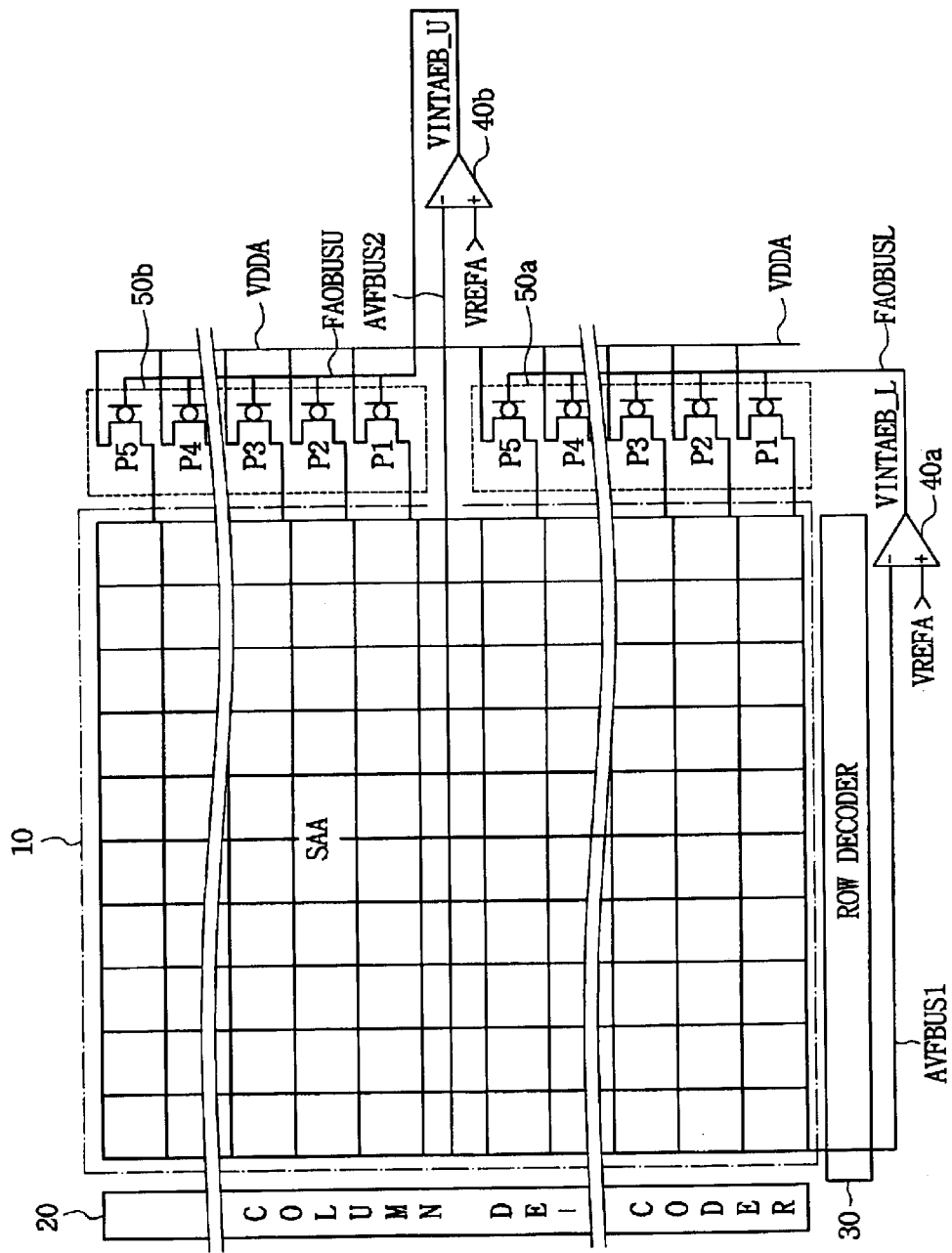
FIG. 4 is a block diagram of another embodiment of an array voltage control circuit according to the present invention.

FIG. 4 illustrates an array voltage control circuit having two feedback loops for one mesh power structure. Specifically, the array voltage control circuit includes a mesh power supply structure 10 constructed with a single mesh power structure corresponding to one memory cell array connected with one column decoder 20 and one row decoder 30. The structure 10 supplies an array voltage to necessary parts of the memory cell array. First and second array voltage feedback amplifiers 40a, 40b compare array voltages independently fed back through two corresponding feedback buses AVFBUS1, AVFBUS2 separately connected with the power supply liner 10 with array reference voltage. The first and second array amplifiers 40a and 40b amplify a resultant difference. First and second array voltage drivers 50a, 50b separately apply array external supply voltage VDDA to the mesh power supply liner 10 in responsive to respective output states of the first and second array voltage feedback amplifiers 40a, 40b.

In FIG. 4, the array voltage control circuit is seen to have two feedback loops. In other words, there are the first and second array voltage feedback amplifiers 40a, 40b connected correspondingly to two feedback buses AVFBUS1, AVFBUS2. At this time, the array voltage control circuit has one mesh power structure relating to one memory cell array. A person of reasonable skill in the art should recognize that more than two feedback loops come within the scope of the present invention.

Figure 5:
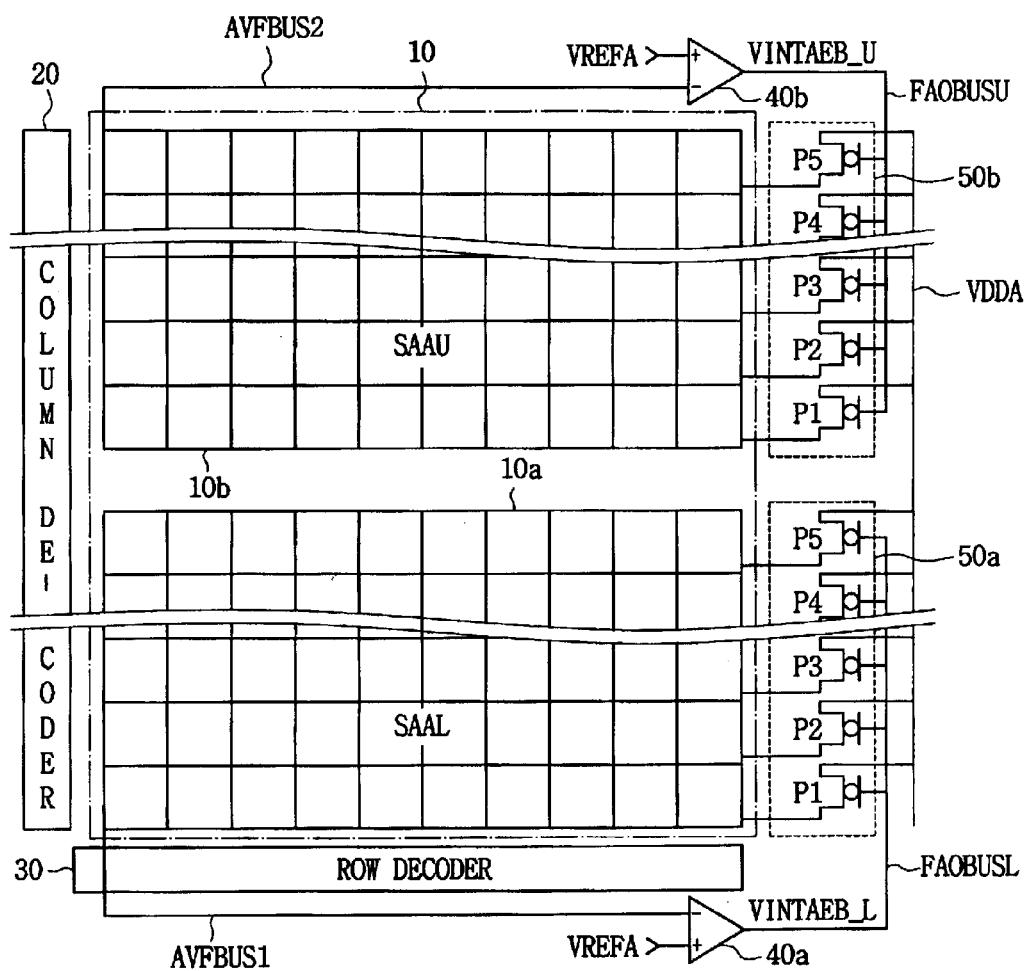
FIG. 5 is a block diagram of another embodiment of an array voltage control circuit according to the present invention.

FIG. 5 illustrates another embodiment of the present invention, where a feedback bus AVFBUS1 transmitting a change in array voltage to an array voltage feedback amplifier 40b is positioned at an upper portion of the relevant array mesh structure. Likewise, the feedback loops can be arranged at different positions on the divisional array voltage mesh structure in consideration of arrangement and characteristics of the relevant array voltage control circuit.

Figure 6:
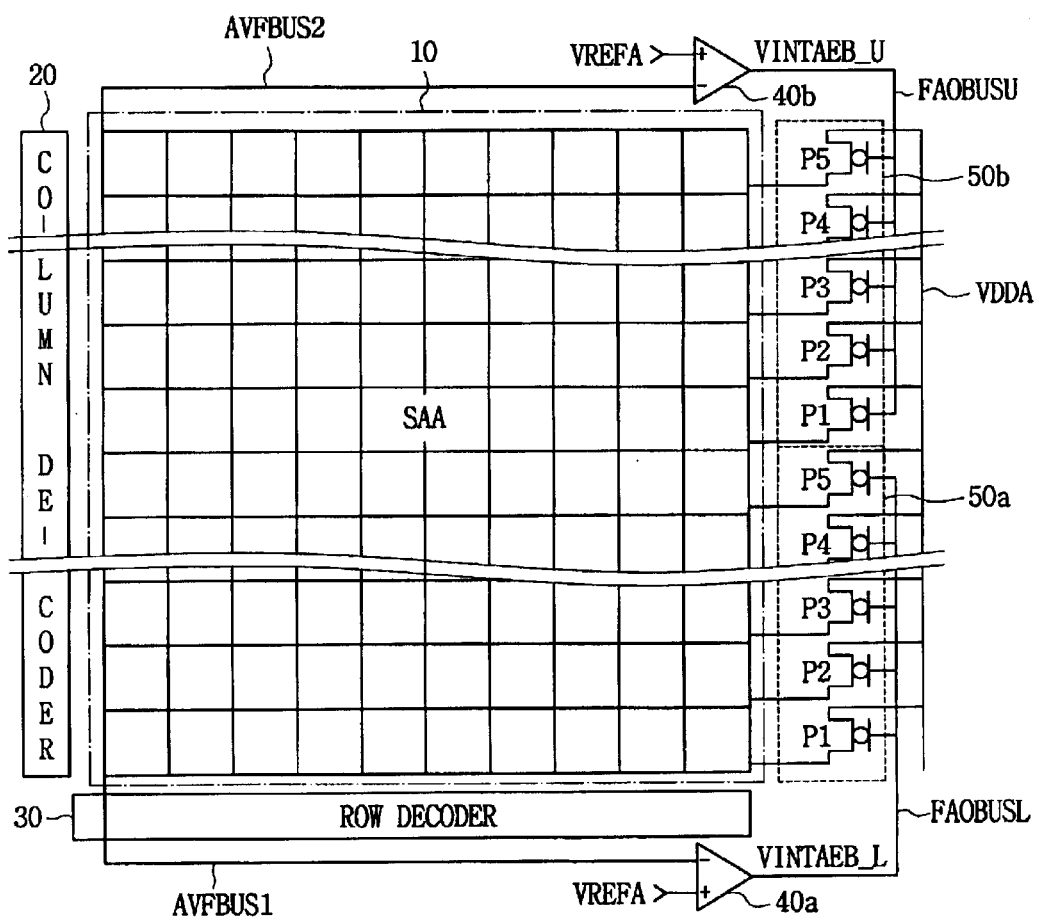
FIG. 6 is a block diagram of another embodiment of an array voltage control circuit according to the present invention.

FIG. 6 illustrates another embodiment of the present invention, where two feedback loops serve a single power mesh array.

Figure 7:
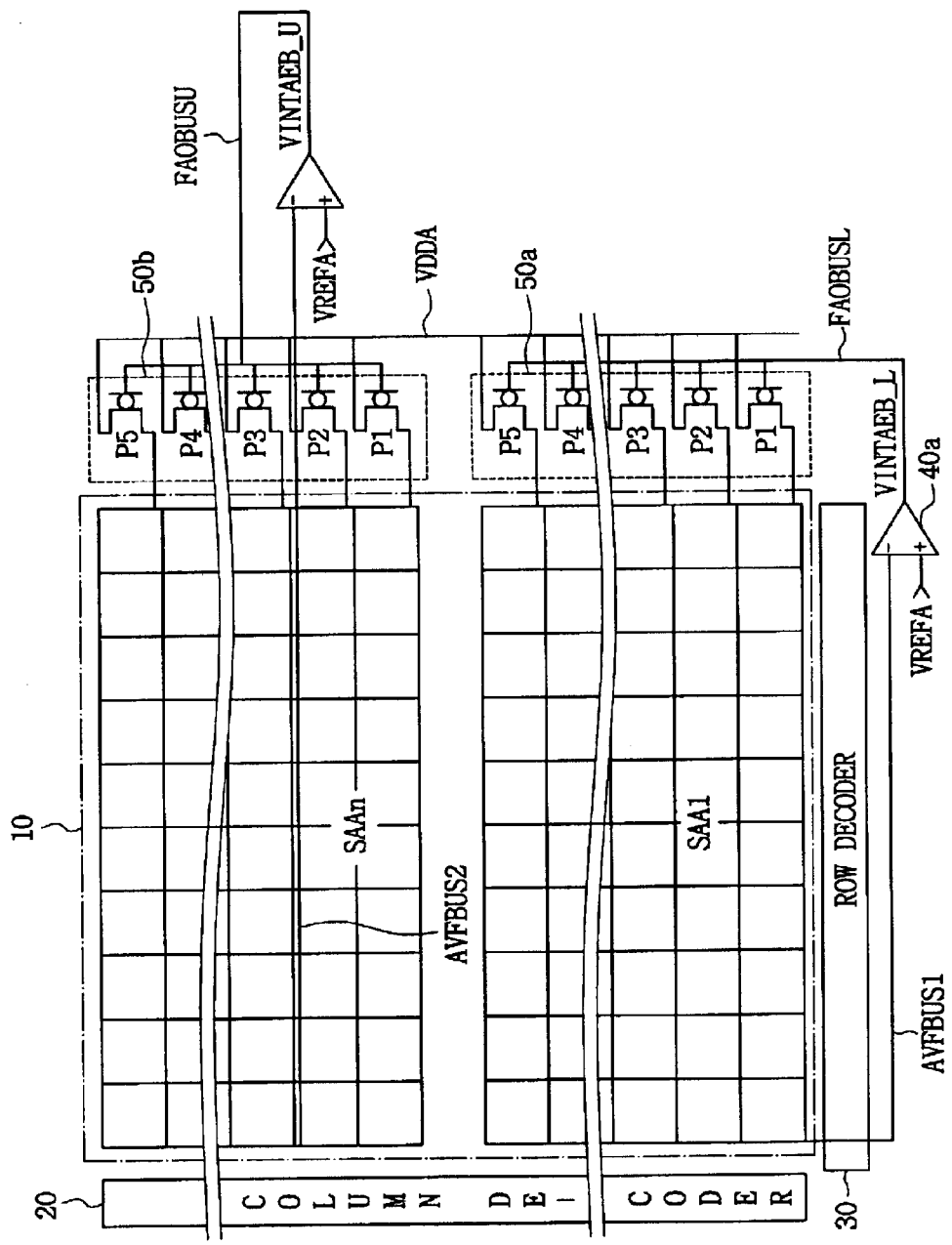
FIG. 7 is a block diagram of another embodiment of an array voltage control circuit according to the present invention.

FIG. 7 illustrates another embodiment of the present invention where an array voltage mesh structure includes a plurality of feedback loops, the feedback buses and feedback amplifiers being arranged at a part of the array voltage mesh structure with no limitation. Put differently, the feedback loops can be arranged according to the center portion of the array mesh structure and the layout of a semiconductor memory device.

The array voltage control circuit constructed with a plurality of feedback loops. That is, a plurality of feedback amplifiers and corresponding feedback output buses and feedback buses, results in a reduction in the load to be taken by the output of the feedback amplifiers, thereby making it possible to achieve stabler array voltage operations than in the known array voltage control circuit.

Having described a specific embodiment of the present invention with reference to the accompanying drawings, it is to be understood that the invention is not limited to those precise embodiments, and that various changes and modifications can be effected therein by one skilled in the art without departing from the scope or spirit of the invention. For instance, it should be taken for granted that the structure and connection of the circuit elements shown in the drawings can be changed or modified depending on various factors including desired operational characteristics, layout, cost, speed, and the like.

As described above, there are advantages in the array voltage control circuit of the present invention having a plurality of feedback loops separately connected to a power line structure covering a memory cell array region in that there is a reduction in the load to be taken by the output of the feedback amplifiers, thereby achieving a more stable array voltage control operation than in the conventional array voltage control circuit.

We claim:

1. A semiconductor memory device, comprising:
    a power supply mesh associated with a memory cell array;
    a plurality of feedback circuits adapted to control supply of an array voltage to predetermined portions of the memory cell array through the power supply mesh;
    where the power supply mesh includes a plurality of divisional liners, each divisional liner being associated with a particular portion of the memory cell array.

2. The semiconductor memory device of claim 1 where each feedback circuit comprises:
    a feedback bus; and
    a feedback amplifier adapted to compare an array reference voltage to an array voltage received from the feedback bus.

3. The semiconductor memory device of claim 1 including a plurality of voltage driver circuits, each voltage driver circuit being adapted to provide the array voltage to the predetermined portions of the memory cell array responsive to corresponding feedback circuits.

4. A semiconductor memory device comprising:
    a power supply mesh associated with a memory cell array; and
    a plurality of feedback circuits adapted to control supply of an array voltage to predetermined portions of the memory cell array through the power supply mesh;
    where the plurality of feedback circuits is capable of maintaining constant a level of the array voltage by providing the array voltage to the power supply mesh through a plurality of paths.

5. A semiconductor memory device comprising:
    a power supply mesh associated with a memory cell array;
    a plurality of feedback circuits adapted to control supply of an array voltage to predetermined portions of the memory cell array through the power supply mesh; and
    a plurality of array voltage drivers adapted to supply the array voltage to the power supply mesh responsive to the plurality of feedback circuits.

6. The semiconductor memory device of claim 1 where the power supply mesh is a single mesh.

7. A semiconductor memory device comprising:
    a power supply mesh associated with a memory cell array; and a plurality of feedback circuits adapted to control supply of an array voltage to predetermined portions of the memory cell array through the power supply mesh;
    where the power supply mesh includes a plurality of divisional supply liners; and
    where each of the plurality of feedback circuits is coupled to one of the divisional supply liners.

* * * * *